United States Patent
Li

(10) Patent No.: US 11,075,330 B2
(45) Date of Patent: Jul. 27, 2021

(54) PACKAGE STRUCTURE AND ELECTRONIC DEVICE

(71) Applicant: GIO Optoelectronics Corp., Tainan (TW)

(72) Inventor: Chin-Tang Li, Tainan (TW)

(73) Assignee: Gio Optoelectronics Corp., Tainan (TW)

( * ) Notice: Subject to any disclaimer, the term of this patent is extended or adjusted under 35 U.S.C. 154(b) by 0 days.

(21) Appl. No.: 16/806,296

(22) Filed: Mar. 2, 2020

(65) Prior Publication Data

US 2020/0287112 A1 Sep. 10, 2020

(30) Foreign Application Priority Data

Mar. 5, 2019 (TW) .................................. 108107173

(51) Int. Cl.
| | |
|---|---|
| *H01L 33/62* | (2010.01) |
| *H01L 33/52* | (2010.01) |
| *H01L 33/60* | (2010.01) |
| *H01L 33/54* | (2010.01) |
| *H01L 23/14* | (2006.01) |
| *H01L 23/498* | (2006.01) |

(52) U.S. Cl.
CPC .......... *H01L 33/62* (2013.01); *H01L 23/4985* (2013.01); *H01L 23/49838* (2013.01); *H01L 33/52* (2013.01); *H01L 33/60* (2013.01); *H01L 2933/005* (2013.01); *H01L 2933/0058* (2013.01); *H01L 2933/0066* (2013.01)

(58) Field of Classification Search
CPC ......... H01L 33/62; H01L 33/52; H01L 33/60; H01L 33/54; H01L 33/56; H01L 2933/0058

See application file for complete search history.

(56) References Cited

U.S. PATENT DOCUMENTS

2012/0193665 A1* 8/2012 Yamada ................. H01L 24/17
257/98
2017/0294424 A1* 10/2017 Jeong ................. H01L 25/0753

* cited by examiner

*Primary Examiner* — Marcos D. Pizarro
*Assistant Examiner* — Antonio B Crite
(74) *Attorney, Agent, or Firm* — Muncy, Geissler, Olds & Lowe, P.C.

(57) ABSTRACT

A package structure and an electronic device including the package structure are disclosed. The package structure includes a substrate, a wire layer disposed on the substrate, a visual unit disposed on the substrate, and an encapsulation element disposed on the substrate. The wire layer includes a plurality of patterned circuits. The visual unit includes a first area and a second area defined along a periphery of the first area. The first area is configured with a photoelectric element, and the photoelectric element is electrically connected to and disposed corresponding to at least one of the patterned circuits. The encapsulation element completely covers the first area of the visual unit and overlaps the corresponding patterned circuit, such that an average reflectance inside the encapsulation element is greater than an average reflectance outside the encapsulation element.

20 Claims, 9 Drawing Sheets

PACKAGE STRUCTURE AND ELECTRONIC DEVICE

CROSS REFERENCE TO RELATED APPLICATIONS

This Non-provisional application claims priority under 35 U.S.C. § 119(a) on Patent Application No(s). 108107173 filed in Taiwan, Republic of China on Mar. 5, 2019, the entire contents of which are hereby incorporated by reference.

BACKGROUND

Technology Field

The disclosure relates to a package structure, a manufacturing method thereof and an electronic device. In particular, the disclosure relates to a package structure, a manufacturing method thereof and an electronic device having a high contrast property.

Description of Related Art

The light-emitting diode is a light-emitting element made by semiconductor materials. The light-emitting diode has two electrode terminals. When a very small voltage is applied between the electrode terminals, the electrons and the holes can be combined to release the remaining energy in the format of light. Different from the ordinary incandescent bulbs, the light-emitting diodes are cold illuminance, which has the advantages of low power consumption, long component life, no need for warming time, and fast response. Moreover, the light-emitting diodes have the features of small size, vibration resistance, and mass production capability, so that they can be easy fabricated as a small or array module to meet the needs of applications. Accordingly, the light-emitting diodes have been widely used in the fields of lighting equipment, information, communication, the indicator of consumer electronics, the backlight module of the display device, and the display device itself. In fact, the light-emitting diodes have become one of the indispensable important components in daily life.

SUMMARY

This disclosure provides a package structure, a manufacturing method thereof and an electronic device having high contrast property.

One or more exemplary embodiment of the present disclosure provides a manufacturing method of a package structure, which comprises the steps of: preparing a mother substrate, which has a wire layer including a plurality of patterned circuits; defining a plurality of visual units on the mother substrate, wherein each visual unit comprises a first area and a second area, the first area is configured with a photoelectric element, the photoelectric element is electrically connected to and disposed corresponding to at least one of the patterned circuits, and the second area is defined along the periphery of the first area and encompasses the first area; disposing a plurality of encapsulation elements on the mother substrate, wherein the encapsulation elements completely cover the first areas of the visual units, respectively, and overlap the corresponding ones of the patterned circuits, such that the average reflectance inside each encapsulation element is greater than the average reflectance outside the encapsulation element; and cutting the mother substrate along the periphery of each vision unit.

In one embodiment, the step of defining a plurality of visual units on the mother substrate further comprises: forming a plurality of light reflective layers on the mother substrate, wherein each light reflective layer is disposed above or below the wire layer, and at least a part of the light reflective layer defines the first area of the visual unit.

In one embodiment, the step of defining a plurality of visual units on the mother substrate further comprises: forming a plurality of light absorption layers on the mother substrate, wherein each light absorption layer is disposed along the periphery of the first area of each visual unit and encompassing the first area of each visual unit, and the light absorption layer defines the second area of the visual unit.

In one embodiment, in the step of preparing a mother substrate, the mother substrate is a light absorption substrate or a light reflection substrate.

In one embodiment, in the step of forming a plurality of light reflective layers on the mother substrate, the wire layer is disposed between the light reflective layer and the mother substrate.

In one embodiment, the step of defining a plurality of visual units on the mother substrate further comprises: forming a plurality of light absorption layers on the mother substrate, wherein each light absorption layer is disposed along the periphery of the first area of each visual unit and encompasses the first area, and the light absorption layer defines the second area of the visual unit. In the step of forming a plurality of light reflective layers on the mother substrate, the wire layer is disposed between the light reflective layer and the mother substrate, or the light reflective layer is disposed between the wire layer and the mother substrate.

In one embodiment, before the step of cutting the mother substrate along the periphery of each vision unit, the manufacturing method further comprises steps of: forming a plurality of first electrical connecting pads on the mother substrate, wherein the periphery of each visual unit is configured with at least one of the first electrical connecting pads, and the first electrical connecting pads are disposed corresponding to the patterned circuits of the wire layer; and forming a plurality of second electrical connecting pads on the wire layer of the mother substrate, wherein the photoelectric element of each visual unit is electrically connected to the wire layer through the corresponding second electrical connecting pad.

In one embodiment, before the step of cutting the mother substrate along the periphery of each vision unit, the manufacturing method further comprises steps of: forming a plurality of through holes on the mother substrate, wherein the through holes are disposed corresponding to the patterned circuits of the wire layer; and disposing a conductive element in each through hole, wherein the conductive element is electrically connected to the corresponding patterned circuit, such that the conductive element is electrically connected to the photoelectric element of each visual unit through the corresponding patterned circuit.

In one embodiment, in the step of disposing a plurality of encapsulation elements on the mother substrate, each encapsulation element further overlaps the second area of the corresponding visual unit.

One or more exemplary embodiment of the present disclosure also provides a package structure, which comprises a substrate, a wire layer, a visual unit and an encapsulation element. The wire layer is disposed on the substrate and comprises a plurality of patterned circuits. The visual unit is disposed on the substrate. The visual unit comprises a first area and a second area defined along a periphery of the first area and encompassing the first area. The first area is configured with a photoelectric element, and the photoelectric element is electrically connected to and disposed corresponding to at least one of the patterned circuits. The encapsulation element is disposed on the substrate. The encapsulation element completely covers the first area of the visual unit and overlaps the corresponding one of the patterned circuits, such that an average reflectance inside the encapsulation element is greater than an average reflectance outside the encapsulation element.

In one embodiment, the substrate is a flexible substrate.

In one embodiment, the substrate is a light absorption substrate or a light reflection substrate.

In one embodiment, the package structure further comprises a light reflective layer disposed on the substrate, wherein the light reflective layer is disposed above or below the wire layer, and at least a part of the light reflective layer is defined as the first area of the visual unit.

In one embodiment, the package structure further comprises a light absorption layer disposed on the substrate, wherein the light absorption layer is disposed along the periphery of the first area of the visual unit and encompasses the first area, and the light absorption layer is defined as the second area of the visual unit.

In one embodiment, the package structure further comprises a light absorption layer disposed on the substrate or the light reflective layer, wherein the light absorption layer is disposed along the periphery of the first area of the visual unit and encompassing the first area, and the light absorption layer is defined as the second area of the visual unit.

In one embodiment, the wire layer is disposed between the light reflective layer and the substrate.

In one embodiment, the wire layer is disposed between the light reflective layer and the substrate, or the light reflective layer is disposed between the wire layer and the substrate.

In one embodiment, the package structure further comprises a plurality of first electrical connecting pads and a plurality of second electrical connecting pads. The plurality of first electrical connecting pads are disposed on the substrate, and the first electrical connecting pads are disposed around the visual unit and corresponding to the patterned circuits of the wire layer. The plurality of second electrical connecting pads are disposed on the substrate. The second electrical connecting pads are disposed on the wire layer, and the photoelectric element of the visual unit is connected to the wire layer through the second electrical connecting pad.

In one embodiment, the package structure further comprises a plurality of through holes and a conductive element. The plurality of through holes are disposed on the substrate, and the through holes are disposed corresponding to the patterned circuits of the wire layer. The conductive element is disposed in the through holes and electrically connected to the corresponding patterned circuits. The conductive element is electrically connected to the photoelectric element of the visual unit through the corresponding patterned circuits.

One or more exemplary embodiment of the present disclosure further provides an electronic device, which comprises a driving circuit board, a plurality of package structures, and a plurality of conductive materials. The driving circuit board comprises a conductive layer. The plurality of package structures can be any of the above mentioned package structures, and are disposed on the driving circuit board. The plurality of conductive materials are disposed on the conductive layer. The photoelectric element of each package structure is electrically connected to the conductive layer of the driving circuit board through the patterned circuits and the conductive materials.

As mentioned above, in the package structure, manufacturing method thereof and electronic device of this disclosure, the visual unit comprises a first area configured with the photoelectric element, and a second area defined along the periphery of the first area and encompassing the first area. Accordingly, when the encapsulation element, which is likely transparent itself with or without powders, completely covers the first area of the visual unit, the average reflectance inside the encapsulation element is greater than an average reflectance outside the encapsulation element, within the package structure. As a result, the package structure and electronic device of this disclosure can have a high contrast property, thereby improving product competitiveness.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
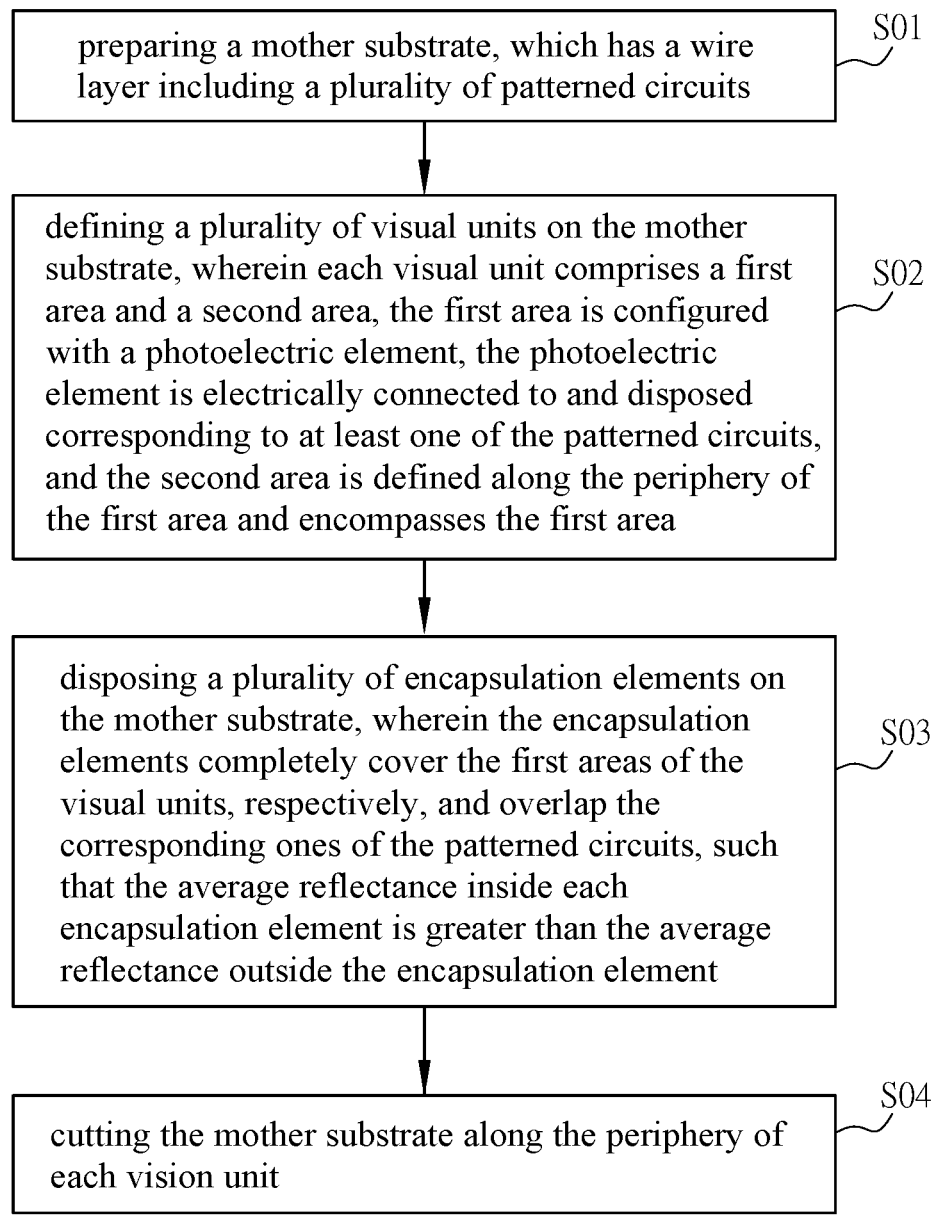
FIG. 1 is a flow chart of a manufacturing method of a package structure according to an embodiment of this disclosure.

FIG. 1 is a flow chart of a manufacturing method of a package structure according to an embodiment of this disclosure.

Referring to FIG. 1, the manufacturing method of a package structure comprises the following steps of: preparing a mother substrate, which has a wire layer including a plurality of patterned circuits (step S01); defining a plurality of visual units on the mother substrate, wherein each visual unit comprises a first area and a second area, the first area is configured with a photoelectric element, the photoelectric element is electrically connected to and disposed corresponding to at least one of the patterned circuits, and the second area is defined along the periphery of the first area and encompasses the first area (step S02); disposing a plurality of encapsulation elements on the mother substrate, wherein the encapsulation elements completely cover the first areas of the visual units, respectively, and overlap the corresponding ones of the patterned circuits, such that the average reflectance inside each encapsulation element is greater than the average reflectance outside the encapsulation element (step S03); and cutting the mother substrate along the periphery of each vision unit (step S04). In this embodiment, the mother substrate may comprise a rigid substrate or a flexible substrate. In some embodiments, if the mother substrate comprises a flexible substrate, the flexible substrate can be formed on a rigid carrier, so that the wire, circuits or elements can be properly formed on the flexible substrate in the following processes. Afterwards, the rigid carrier can be removed to provide the desired product. To be noted, if the mother substrate comprises the rigid substrate, this step relating to the rigid carrier is not needed.

The steps of the above manufacturing method will be described in details with reference to FIG. 1 in view of FIGS. 2A to 2H. FIGS. 2A to 2H are schematic diagrams showing the manufacturing procedure of the package structure 1 according to an embodiment of this disclosure.

First, the step S01 is to prepare a mother substrate 11. Herein, the mother substrate 11 may comprise an insulation substrate, which can be made of glass, resin, metal, ceramics, or composite materials. The resin material is a flexible material, and may comprise organic polymer material. The glass transition temperature (Tg) of the organic polymer material is, for example, between 250° C. and 600° C., and preferably between 300° C. and 500° C. Since the organic polymer material has a relative higher glass transition temperature, the elements, wires or circuits can be directly formed on the flexible substrate in the following processes. The organic polymer material can be a thermoplastic material, such as polyimide (PI), polyethylene (PE), polyvinylchloride (PVC), polystyrene (PS), acrylic, fluoropolymer, polyester, or nylon.

Figure 2A:
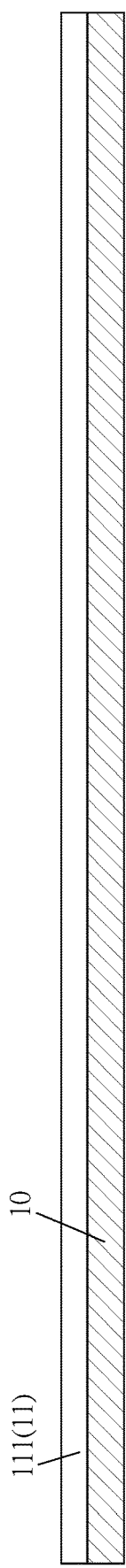
FIGS. 2A to 2H are schematic diagrams showing the manufacturing procedure of the package structure according to an embodiment of this disclosure.
Figure 2B:
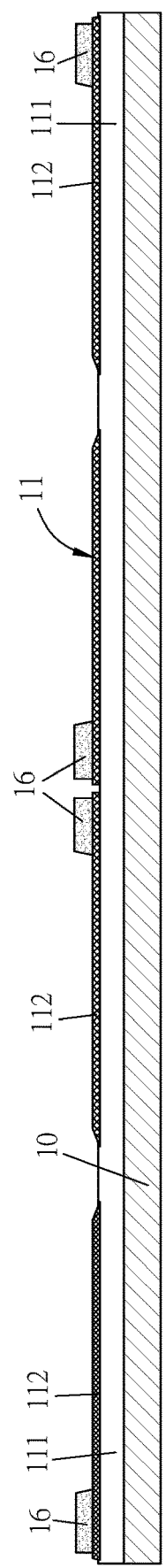

As shown in FIG. 2A, the mother substrate 11 of this embodiment comprises a flexible substrate 111 (e.g. PI), which is formed on a rigid carrier 10 by, for example, adhesion or coating. In addition, as shown in FIG. 2B, the mother substrate 11 further comprises a wire layer (not labeled), which comprises a plurality of patterned circuits 112. As shown in FIG. 2B, the wire layer comprises four patterned circuits 112. The patterned circuits 112 can be the thin-film conductive circuits fabricated by the thin-film process. The thin-film process can be a semiconductor manufacturing process, which comprises the low-temperature polycrystalline silicon (LTPS) process, the amorphous silicon (α-Si) process, or the metal oxide semiconductor process (e.g. IGZO). Alternatively, the patterned circuits 112 can also be the conductive circuits made of copper foil or other conductive materials, and this disclosure is not limited. In some embodiments, the substrate 111 can be further provided with thin-film elements, conductive circuits or thin-film layers so as to form, for example, the thin-film transistors, thin-film resistors, capacitors, conductive layers, metal layers, insulation layers, transmission wires for scan signals and data signals, and the likes, so that the products can be jointed to manufacture an active matrix electronic device.

As shown in FIG. 2B, before the step S04 of cutting the mother substrate along the periphery of each vision unit, the manufacturing method of this embodiment may further comprise a step of: forming a plurality of first electrical connecting pads 16 on the mother substrate 11, wherein the first electrical connecting pads 16 are disposed corresponding to the patterned circuits 112 of the wire layer. The material of the first electrical connecting pads 16 can be, for example but not limited to, Cu, Ag, Au, or their combinations, or any of other suitable conductive materials. In this embodiment, the first electrical connecting pads 16 can be formed by, for example, printing or any of other suitable manufacturing methods. Herein, the (four) first electrical connecting pads 16 are individually formed on the (four) patterned circuits 112, respectively, and each first electrical connecting pad 16 directly contacts and electrically connects to the corresponding patterned circuit 112.

Figure 2C:
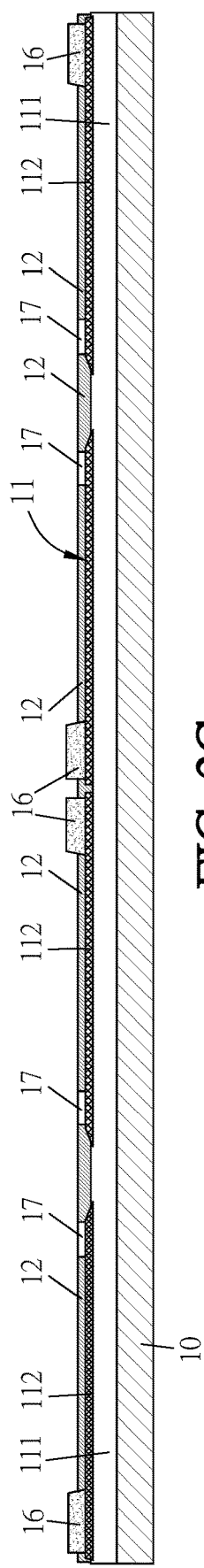

In addition, as shown in FIG. 2C, before the step S02 of defining a plurality of visual units on the mother substrate, the manufacturing method may further comprise a step of: directly or indirectly forming a plurality of light reflective layers 12 on the mother substrate 11. In this embodiment, the light reflective layer 12 can be made of, for example but not limited to, a white photoresist. The light reflective layers 12 are formed on the mother substrate 11 or the patterned circuits 112 by, for example, coating, printing, or any of other suitable methods. Moreover, the light reflective layers 12 can also be formed on the proper positions on the patterned circuits 112 and the substrate 111. The light reflective layers 12 can reflect the light irradiated toward the substrate 111, thereby increasing the light output efficiency and contrast. To be noted, the step of forming a plurality of light reflective layers 12 can be performed after the manufacturing process of forming the wire layer, so that the light reflective layers 12 can be formed above the wire layer (the patterned circuits 112) as the embodiment shown in FIG. 2C. Alternatively, the step of forming a plurality of light reflective layers 12 can be performed before the manufacturing process of forming the wire layer, so that the light reflective layers 12 can be formed below the wire layer (the patterned circuits 112) (not shown). This disclosure is not limited thereto.

Figure 2D:
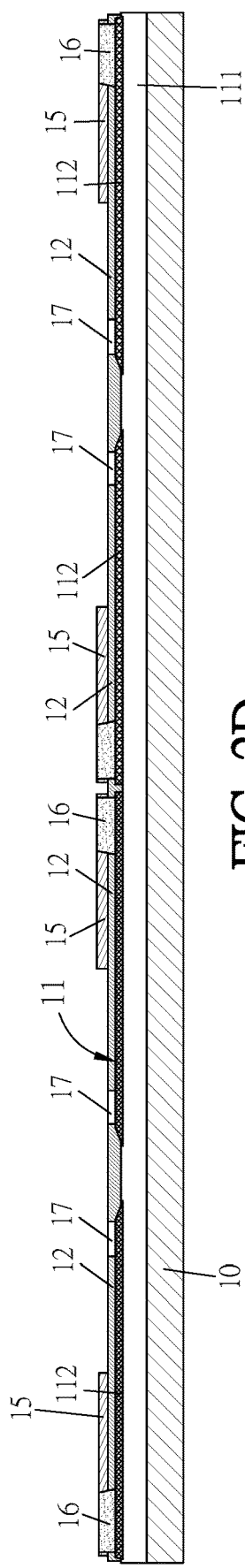

In addition, as shown in FIG. 2D, before the step S02 of defining a plurality of visual units on the mother substrate, the manufacturing method may further comprise a step of: directly or indirectly forming a plurality of light absorption layers 15 on the mother substrate 11. In this embodiment, the light absorption layer 15 can be made of, for example but not limited to, a black photoresist, which is formed by, for example, coating, printing, or any of other suitable methods. Herein, the light absorption layer 15 is formed on the light reflective layer 12 and is located next to the first electrical connecting pad 16. In other embodiments, the step of forming a plurality of light absorption layers 15 or a plurality of first electrical connecting pads 16 on the mother substrate 11 can be performed before or after the step S02 of defining a plurality of visual units on the mother substrate, and this disclosure is not limited thereto.

Figure 2E:
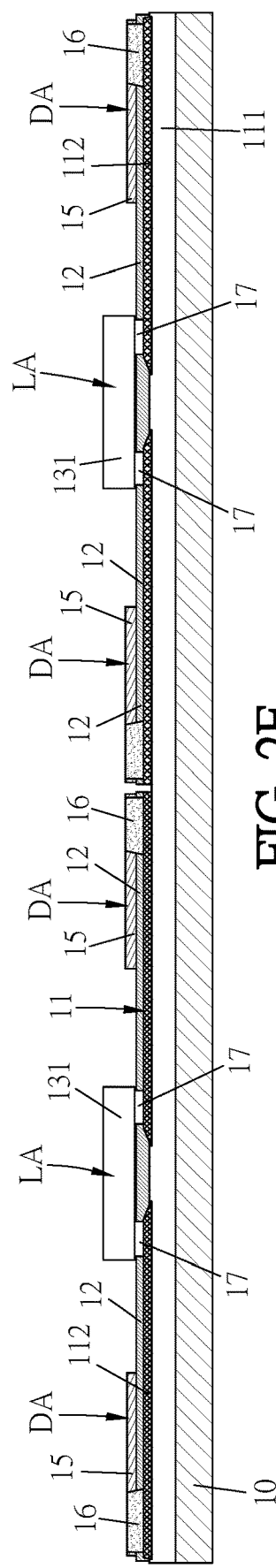

Next, as shown in FIG. 2E, the step S02 is performed to form a plurality of visual units 13 on the mother substrate 11, wherein each visual unit 13 comprises a first area LA and a second area DA, the first area LA is directly or indirectly configured with a photoelectric element 131, the photoelectric element 131 is configured on the mother substrate 11 and is electrically connected to and disposed corresponding to at least one of the patterned circuits 112, and the second area DA is defined along the periphery of the first area LA and encompasses the first area LA. Obviously, the first area LA is an area configured with the photoelectric element 131 (and also with the light reflective layer 12 in this case), and the photoelectric element 131 can emit light (or the light reflective layer 12 can reflect light) so as to present as a bright zone; the second area DA is an area at least configured with the light absorption layer 15 in this embodiment, so that the light absorption layer 15 can absorb the light to present as a dark zone. This configuration of the dark zone set beside the bright zone of the visual unit 13 can improve the contrast of the package structure. In some embodiments, the visual unit 13 may comprise, for example, three photoelectric elements 131 for constructing three sub-pixels. In this disclosure, the brightness of the first area LA is at least greater than 50% of the average brightness of the visual unit 13 as the bright zone, and the brightness of the second area DA is at least less than 50% of the average brightness of the visual unit 13 as the dark zone.

In this embodiment, the photoelectric element 13 can be a flip-chip type photoelectric component including at least one electrode such as, for example but not limited to, an LED, a Mini LED, or a Micro LED. In this embodiment, the photoelectric element 13 includes two electrodes (not shown). In order to electrically connect to the electrodes of the photoelectric element 131, before the step S02 of defining a plurality of visual units 13 on the mother substrate 11, the manufacturing method of this disclosure further comprises a step of: forming a plurality of second electrical connecting pads 17 on the wire layer (the patterned circuits 112) of the mother substrate 11, wherein the photoelectric element 131 of each visual unit 13 is electrically connected to the wire layer (the patterned circuits 112) through the corresponding second electrical connecting pad 17. The material of the second electrical connecting pads 17 can be, for example but not limited to, Cu, Ag, Au, or their combinations, or any of other suitable conductive materials. In this embodiment, the second electrical connecting pads 17 can be formed by, for example, printing or any of other suitable manufacturing methods, and each photoelectric element 131 can be electrically connected to the corresponding patterned circuit 112 through two second electrical connecting pads 17. In some embodiments, the two electrodes of the photoelectric element 131 can be electrically connected to the second electrical connecting pads 17, respectively, by solder bumps, Au bumps, Cu paste, Ag paste, or ACP. The solder bumps and Au bumps can be formed by a heating process. In other embodiments, the photoelectric element 131 can also be electrically connected to the corresponding patterned circuit 112 by wire bonding, and this disclosure is not limited thereto.

In this embodiment, as shown in FIG. 2E, some of the light reflective layers 12 are disposed below the photoelectric element 131 of the visual unit 13 for reflecting the light emitted from the bottom of the photoelectric element 131 toward the substrate 111, thereby increasing the light output efficiency. In addition, each light absorption layer 15 is disposed along the periphery of the first area LA of each visual unit 13 and encompass the corresponding first area LA. Accordingly, the light absorption layer 15 is defined as the second area DA, a dark zone, of the visual unit 13, and a part of the light reflective layer 12 with the photoelectric element 131 are defined as the first area LA, a bright zone, of the visual unit 13. In other words, in this embodiment, the region configured without the light absorption layer 15 may be defined as the above-mentioned first area LA, while the region configured with the light absorption layer 15 is defined as the above-mentioned second area DA. Moreover, the second area DA can be also defined as a dark zone, along the periphery of a bright zone, the first area LA (the second area DA surrounds the first area LA); please to be noted, the wordings "bright zone" and "dark zone" are not limited to specific embodiments, but relate to embodiments serving zones capable of visually comparable with each other. In the step of forming a plurality of first electrical connecting pads 16, the periphery of each visual unit 13 is configured with at least one first electrical connecting pad 16. In this embodiment, the periphery of each visual unit 13 is configured with multiple first electrical connecting pads 16 (FIG. 2E shows two first electrical connecting pads 16), so that the first electrical connecting pads 16 can electrical connect to the corresponding photoelectric element 131 through the corresponding patterned circuit 112 and second electrical connecting pads 17.

Figure 2F:
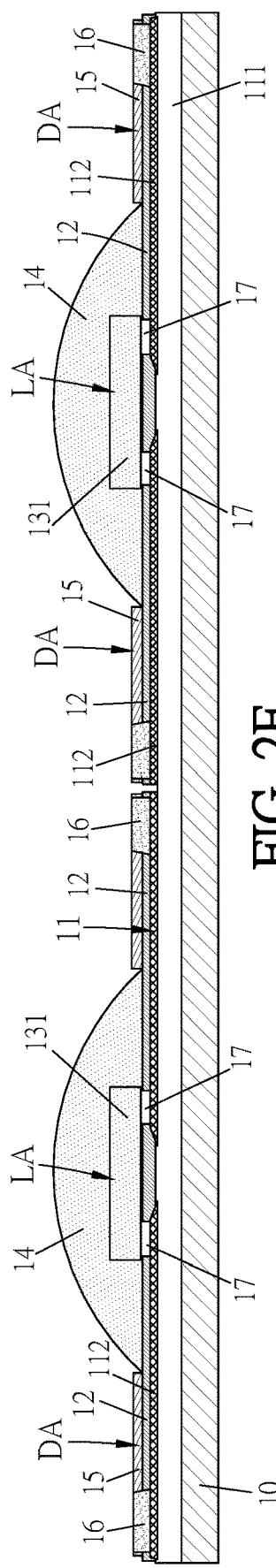
Figure 2G:
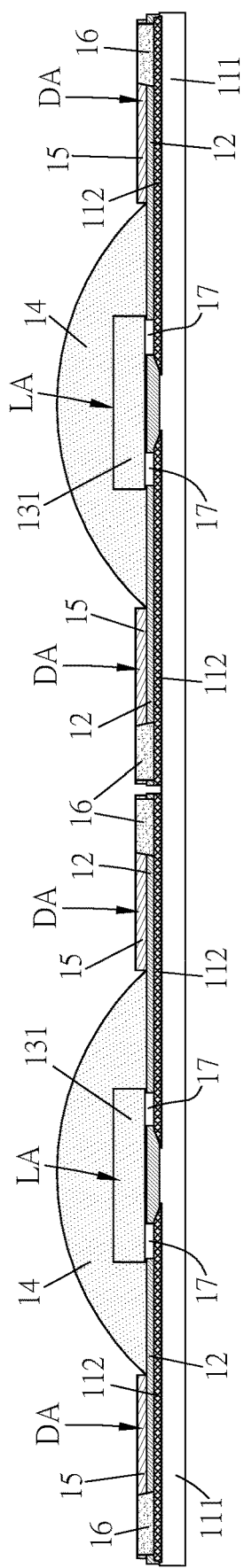

Afterwards, as shown in FIG. 2F, the step S03 is performed to dispose a plurality of encapsulation elements 14 on the mother substrate 11, wherein the encapsulation elements 14 completely cover the first areas LA of the visual units 13, respectively, and overlap the corresponding patterned circuits 112, such that the average reflectance inside each encapsulation element 14 is greater than the average reflectance outside the encapsulation element 14. In this step S03, the encapsulation elements 14 completely cover the first areas LA of the visual units 13, respectively, so that the region covered by the encapsulation element 14 can be defined as the above-mentioned first area LA, and the region uncovered by the encapsulation element 14 can be defined as the above-mentioned second area DA. The encapsulation elements 14 can be formed by curing the transparent encapsulating material, which is provided to completely cover the first areas LA and to overlap of light reflective layers 12 and the corresponding patterned circuits 112. The configuration of the encapsulation elements 14 can block moisture and dusts from outside, thereby protecting the structures and characteristics of the photoelectric elements 131, the patterned circuits 112 and the light reflective layers 12.

In some embodiments, based on the design requirements, the encapsulation elements 14 can be configured to modulate the color of the output light. For example, if the encapsulation element 14 is made of a package paste added with fluorescent powder, the color of the output light can be controlled by selecting a photoelectric element 131 with a proper color. For example, the blue photoelectric element 131 and a yellow fluorescent powder can be selected to provide a white light. In this case, the edge of the encapsulation element 14 of this embodiment is located between the light absorption layer 15 and the photoelectric element 131, and the encapsulation element 14 does not cover the light absorption layer 15. In other cases, the encapsulation element 14 in the corresponding visual unit 13 may further overlap the light absorption layer 15, and this disclosure is not limited thereto.

Figure 2H:
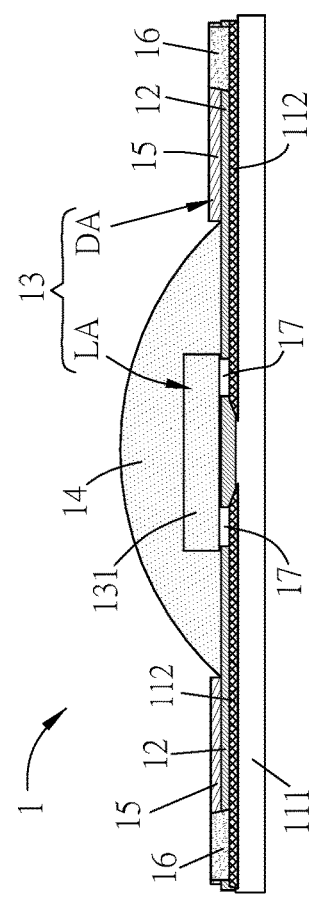

Finally, the step S04 is to cut the mother substrate 11 along the periphery of each vision unit 13. In this embodiment, the mother substrate 11 is cut along the periphery of each visual unit 13, and in particular, along the line between two adjacent first electrical connecting pads 16, thereby obtaining a plurality of package structures 1 as shown in FIG. 2H. To be noted, before the step S04 of cutting the mother substrate 11, the manufacturing method of this embodiment further comprises a step of removing the rigid carrier 10 (see FIG. 2G). Of course, in other embodiments, the rigid carrier 10 can be removed after the cutting step S04, and this disclosure is not limited.

With reference to FIG. 2H, the package structure 1 comprises a substrate 111, a wire layer (not labeled) disposed on the substrate 111, a visual unit 13 defined on the substrate 111, and an encapsulation element 14 disposed on the substrate 111. The substrate 111 is a flexible substrate. Of course, in other embodiments, the substrate 111 can be a rigid substrate. The wire layer comprises a plurality of patterned circuits 112. The visual unit 13 comprises a first area LA and a second area DA defined along the periphery of the first area LA and encompasses the first area LA. The first area LA is configured with a photoelectric element 131, and the photoelectric element 131 is electrically connected to and disposed on a corresponding one of the patterned circuits 112. In this embodiment, the encapsulation element 14 completely covers the first area LA of the visual unit 13 and overlaps the corresponding patterned circuit 112, such that an average reflectance inside the encapsulation element 14 is greater than an average reflectance outside the encapsulation element 14 within each of the package structures 1. Accordingly, the manufactured package structure 1 can have a high contrast property.

In addition, the package structure 1 of this embodiment further comprises a light reflective layer 12 and a light absorption layer 15. The light reflective layer 12 and the light absorption layer 15 are individually disposed on the substrate 111. The light reflective layer 12 is disposed above the patterned circuit 112, such that the wire layer (the patterned circuit 112) is located between the substrate 111 and the light reflective layer 12. A part of the light reflective layer 12 (which is not covered by the light absorption layer 15) is defined as the first area LA of the visual unit 13. In addition, the light absorption layer 15 is disposed along the periphery of the first area LA of the visual unit 13, and the light absorption layer 15 is defined as the second area DA of the visual unit 13. In this embodiment, the light absorption layer 15 is disposed above the light reflective layer 12, such that a part of the light reflective layer 12 is located between the patterned circuit 112 and the light absorption layer 15.

In addition, the package structure 1 further comprises a plurality of first electrical connecting pads 16 and a plurality of second electrical connecting pads 17. The plurality of first electrical connecting pads 16 and the plurality of second electrical connecting pads 17 are separately disposed on the substrate 111. The first electrical connecting pads 16 are disposed around the visual unit 13 and corresponding to the patterned circuits 112. The first electrical connecting pads 16 directly contact and electrically connect to the corresponding patterned circuits 112. The second electrical connecting pads 17 are disposed on the wire layer, and the photoelectric element 131 is connected to the corresponding patterned circuit 112 of the wire layer through the second electrical connecting pad 17. In this embodiment, the first electrical connecting pads 16 are disposed adjacent to the light reflective layer 12 and the light absorption layer 15, and are located on and connected to the patterned circuit 112, such that the first electrical connecting pads 16 can be electrically connected to the photoelectric element 131 through the corresponding patterned circuit 112 and the second electrical connecting pads 17.

Therefore, in the package structure 1 of this embodiment, through the design of the visual unit 13 of the first area LA configured with the photoelectric element 131, and the design of the second area DA defining along the periphery of the first area and encompassing the first area LA, the encapsulation element 14 is applied onto the visual unit 13 and completely covers the first area LA of the visual unit 13, so that the average reflectance inside the encapsulation element 14 is greater than an average reflectance outside the encapsulation element 14. As a result, the package structure 1 of this disclosure can have a high contrast property, thereby improving product competitiveness.

The package structures of different embodiments of this disclosure will be described hereinafter with reference to FIGS. 3A to 6B. FIGS. 3A, 4A, 5A and 6A are top views of package structures according to different embodiments of this disclosure, FIG. 3B is a sectional view of the package structure of FIG. 3A along the line 3B-3B, FIG. 4B is a sectional view of the package structure of FIG. 4A along the line 4B-4B, FIG. 5B is a sectional view of the package structure of FIG. 5A along the line 5B-5B, and FIG. 6B is a sectional view of the package structure of FIG. 6A along the line 6B-6B. To be noted, the drawings are equivalent in FIGS. 2H and 3B, but with different designated numbers, for example the package structure is labeled as 1a, for convenient recitation and comprehension in FIG. 3B.

Figure 3A:
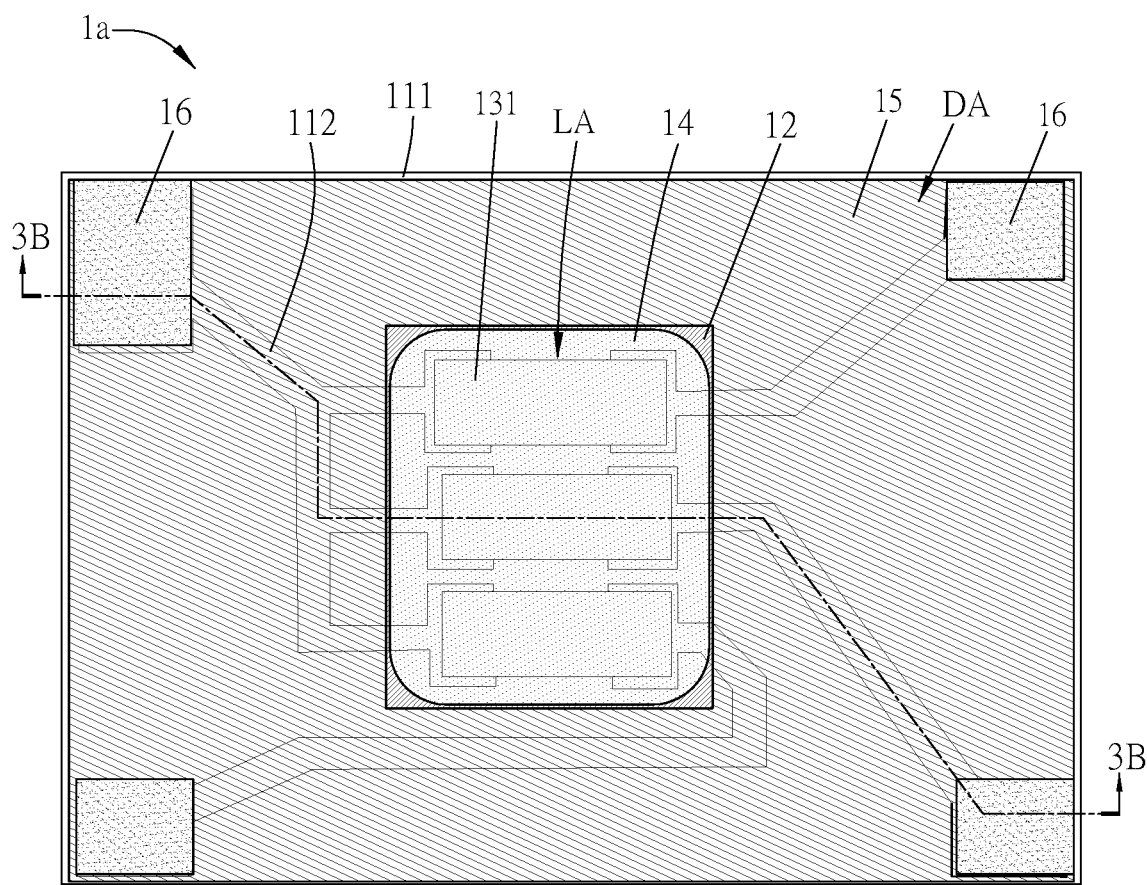
FIGS. 3A, 4A, 5A and 6A are top views of package structures according to different embodiments of this disclosure.
Figure 3B:
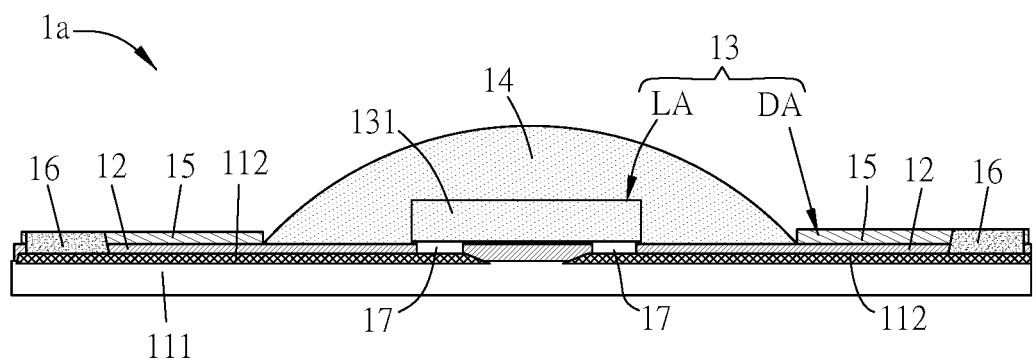
FIG. 3B is a sectional view of the package structure of FIG. 3A along the line 3B-3B.

In the embodiment as shown in FIGS. 3A and 3B, the visual unit 13 of the package structure 1a is configured with, for example, three photoelectric elements 131, which construct three sub-pixels. The three photoelectric elements 131 of the three sub-pixels can be red, blue and green LEDs, Mini LEDs or Micro LEDs for forming a full-color pixel unit. Thus, a plurality of package structures 1a (visual units 13) can be combined to form a full-color LED, Mini LED or Micro LED display device. As shown in FIG. 3A, the three photoelectric elements 131 can have a design of a common anode or a common cathode. In this case, the package structure 1a has four first electrical connecting pads 16, and each first electrical connecting pad 16 is electrically connected to the three photoelectric elements 131 through the corresponding patterned circuits 112.

Figure 4A:
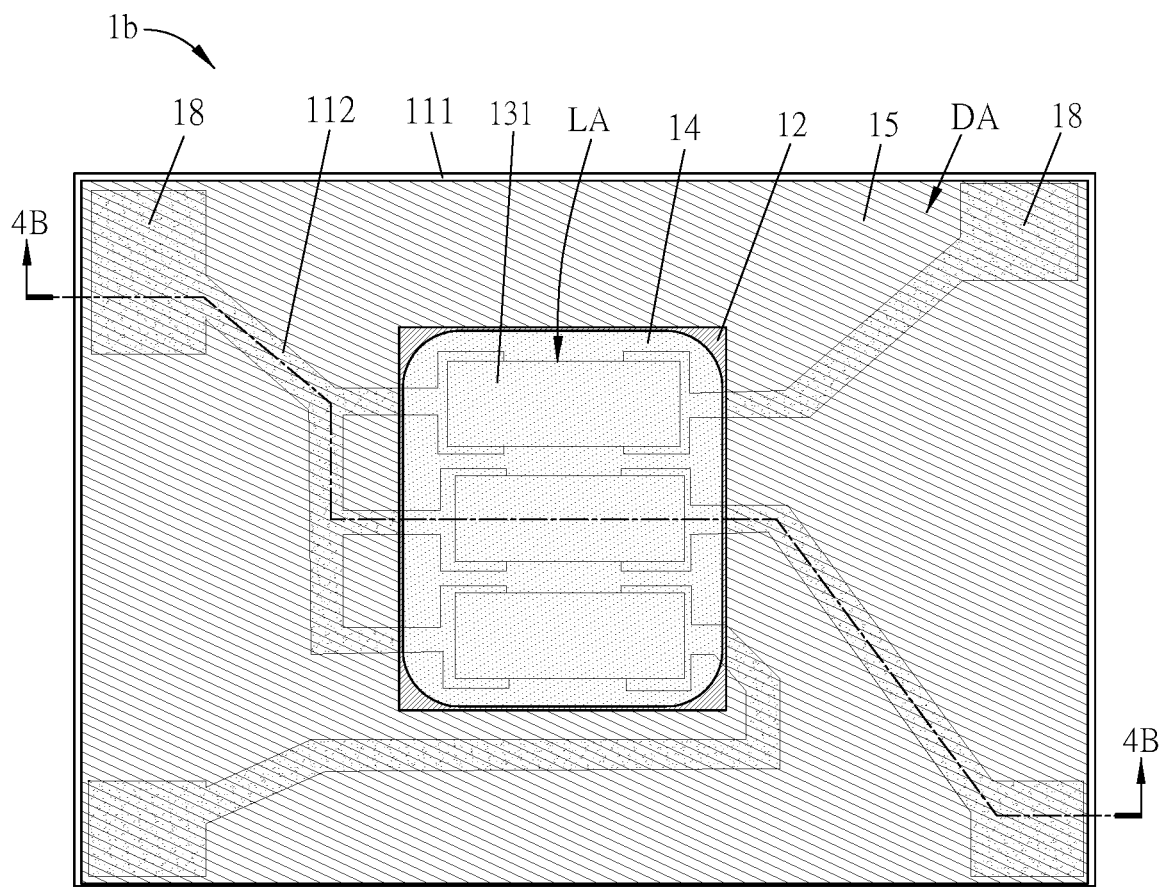
Figure 4B:
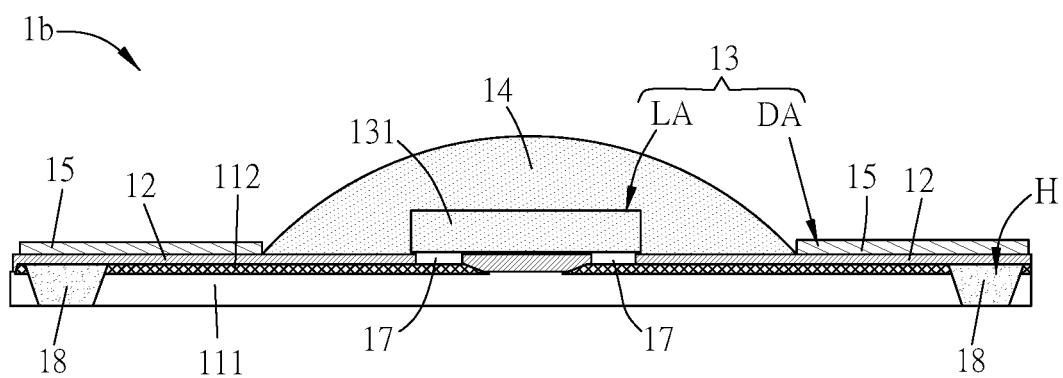
FIG. 4B is a sectional view of the package structure of FIG. 4A along the line 4B-4B.

As shown in FIGS. 4A and 4B, the manufacturing method and structure of the package structure 1b of this embodiment are mostly the same as the manufacturing method and structure of the package structure 1 (or 1a) of the previous embodiment. Different from the previous embodiment, the package structure 1b of this embodiment does not comprise the first electrical connecting pad 16. Besides, before the step S04 of cutting the mother substrate 11 along the periphery of each vision unit 13, the manufacturing method of the package structure 1b further comprises steps of: forming a plurality of through holes H on the mother substrate 11 (the substrate 111), wherein the through holes H are disposed corresponding to the patterned circuits 112 of the wire layer; and disposing a conductive element 18 in each of the through holes H, wherein the conductive element 18 is electrically connected to the corresponding one of the patterned circuits 112, such that the conductive element 18 is electrically connected to the photoelectric element 131 of each visual unit 13 through the corresponding patterned circuit 112. For example, in this embodiment, a laser can be provided to irradiate the substrate 111 for forming a plurality of through holes H penetrating through the top and bottom surfaces, and then the conductive element 18 is filled in the through holes H. Accordingly, the conductive element 18 in the through holes H can electrically connect the top surface of the substrate 111 to the bottom surface of the substrate 111, thereby electrically connecting the second electrical connecting pad 17 to the photoelectric element 131 of the visual unit 13 through the conductive element 18 and the patterned circuit 112. The conductive element 18 can be formed by curing, for example but not limited to, Cu paste, Ag paste, solder paste, or ACP. To be noted, in this step, if the substrate 111 is a flexible material (e.g. PI) and the laser is provided to the bottom surface of the substrate 111 to form the through holes H, the rigid carrier 10 may be removed before the step of forming the through holes H.

Figure 5A:
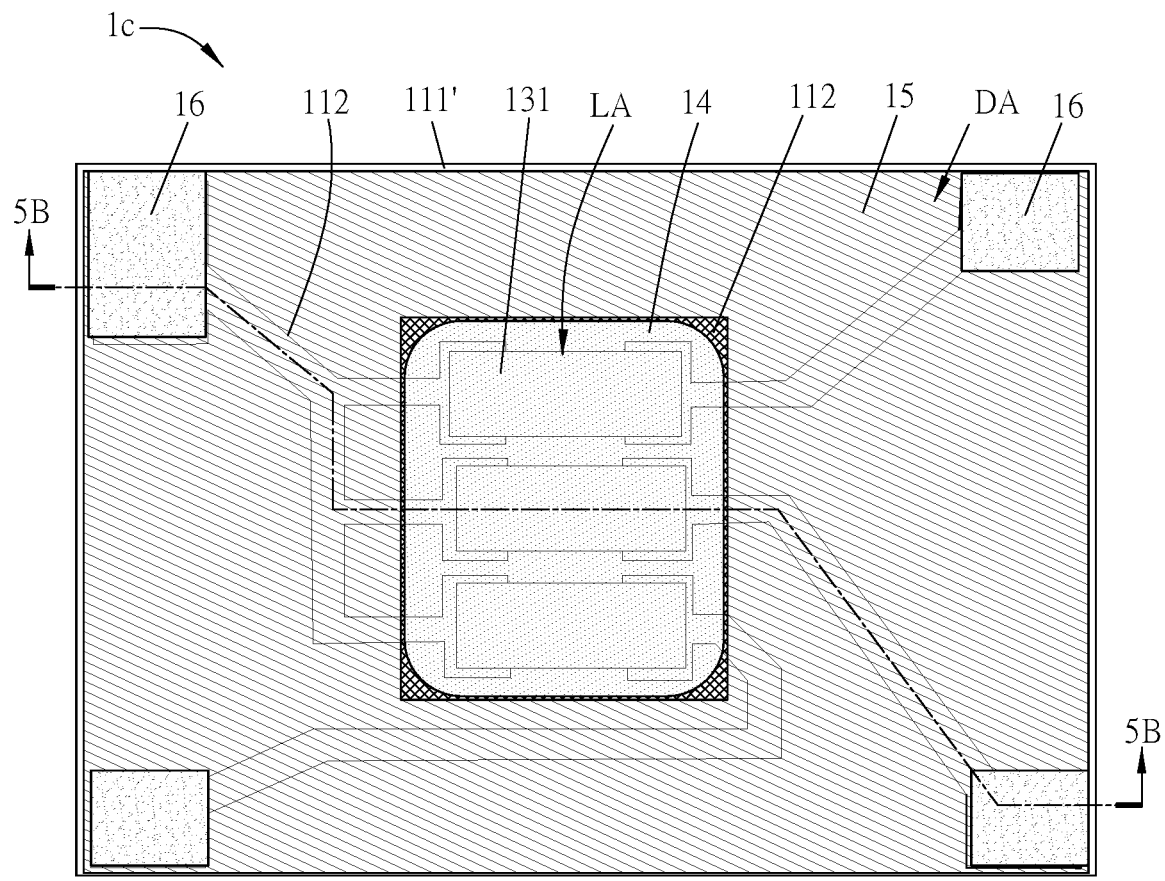
Figure 5B:
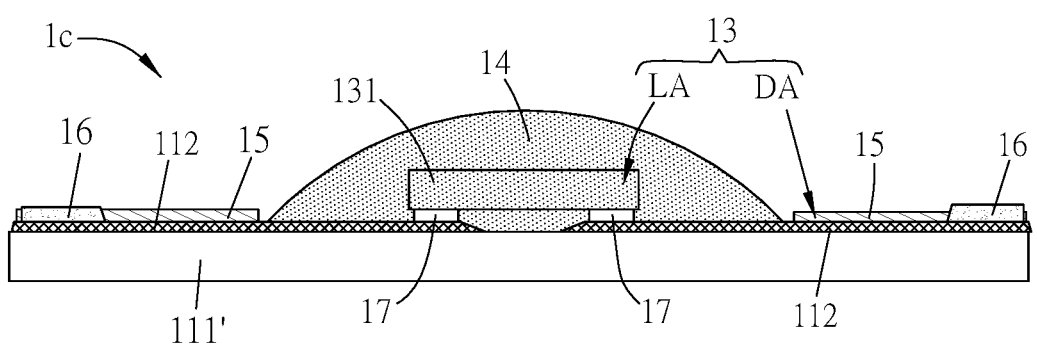
FIG. 5B is a sectional view of the package structure of FIG. 5A along the line 5B-5B.

As shown in FIGS. 5A and 5B, the manufacturing method and structure of the package structure 1c of this embodiment are mostly the same as the manufacturing method and structure of the package structure 1 (or 1a) of the previous embodiment. Different from the previous embodiment, the package structure 1c of this embodiment does not comprise the light reflective layer 12, so that the patterned circuit 112 is disposed between the light absorption layer 15 and the substrate 111'. Since no light reflective layer 12 is configured, in the step S01 of preparing the mother substrate, the mother substrate (substrate 111') itself is a light reflective substrate with high reflectance (either a flexible substrate or a rigid substrate) for directly reflecting the light emitted from the photoelectric element 131 to the substrate 111', thereby increasing the light output efficiency. In some embodiments, the light reflective substrate can be, for example, a white PI film, and the reflectance thereof is far greater than that of the light absorption layer 15.

Figure 6A:
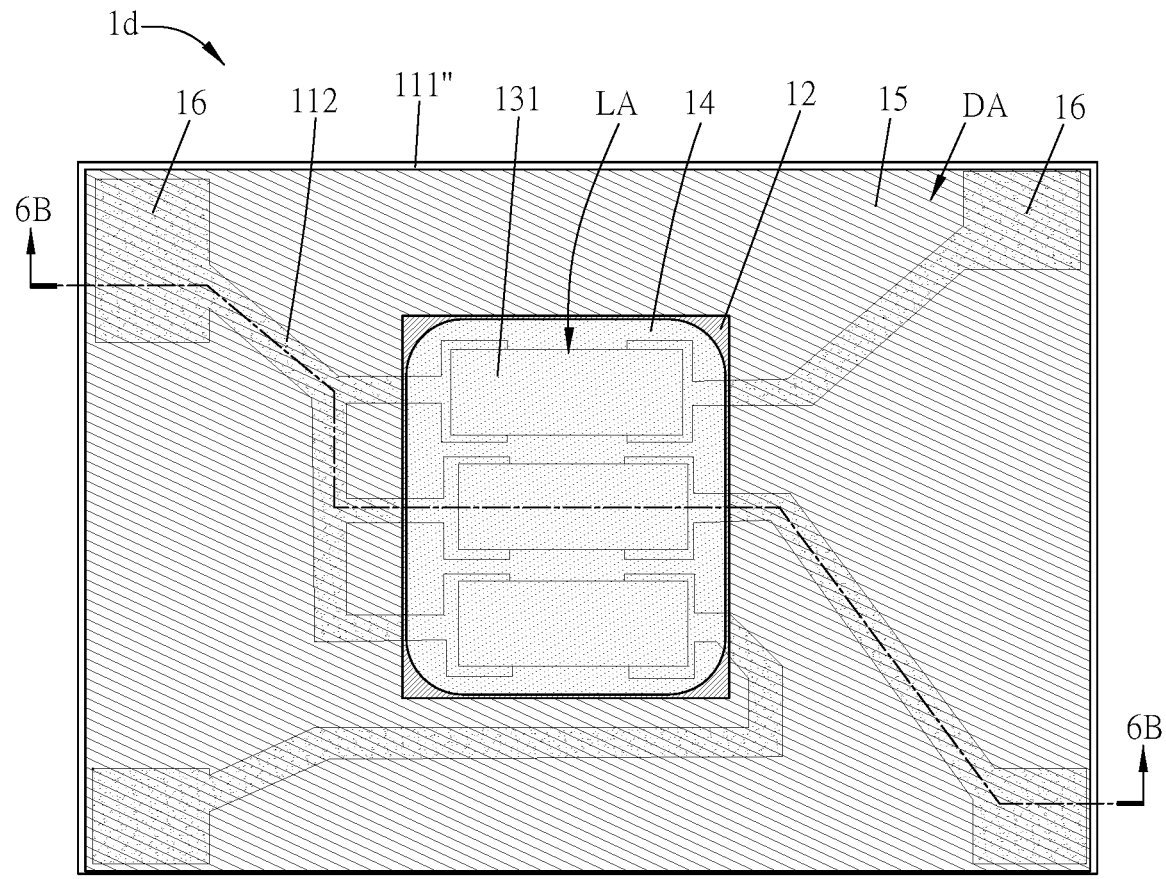
Figure 6B:
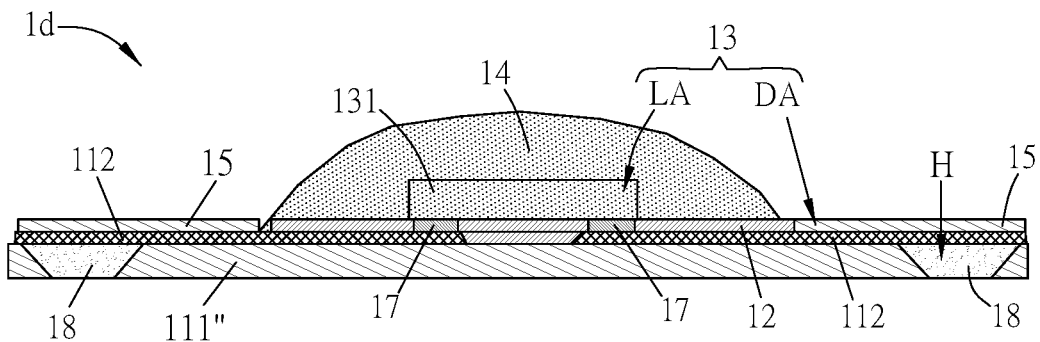
FIG. 6B is a sectional view of the package structure of FIG. 6A along the line 6B-6B.

As shown in FIGS. 6A and 6B, the manufacturing method and structure of the package structure 1d of this embodiment are mostly the same as the manufacturing method and structure of the package structure 1 (or 1a) of the previous embodiment. Different from the previous embodiment, the light reflective layer 12 of the package structure 1d of this embodiment is disposed within the area inside the encapsulation element 14 only, and the light absorption layer 15 is directly formed on the patterned circuits 112 instead of the light reflective layer 12. Accordingly, the patterned circuit 112 is disposed between the light absorption layer 15 and the substrate 111". In addition, in the step S01 of preparing the mother substrate, the mother substrate (substrate 111") itself is a light absorption substrate with low reflectance (either a flexible substrate or a rigid substrate) for absorbing the light emitted from the photoelectric element 131 to the substrate 111", thereby increasing the contrast. In some embodiments, the light absorption substrate can be, for example, a black PI film, and the reflectance thereof is far less than that of the light reflective layer 12. Moreover, the package structure 1d of this embodiment is not configured with the first electrical connecting pad 16, and the top surface and bottom surface of the substrate 111" are electrically connected by the through holes H and the conductive element 18 as shown in the package structure 1b.

To be noted, the design of the light reflective substrate (the substrate 111') of the package structure 1c can also be applied to the other package structures 1a and 1b, and the design of the light absorption substrate (the substrate 111") of the package structure 1d can also be applied to the other package structures 1a and 1b. This disclosure is not limited thereto.

Figure 7:
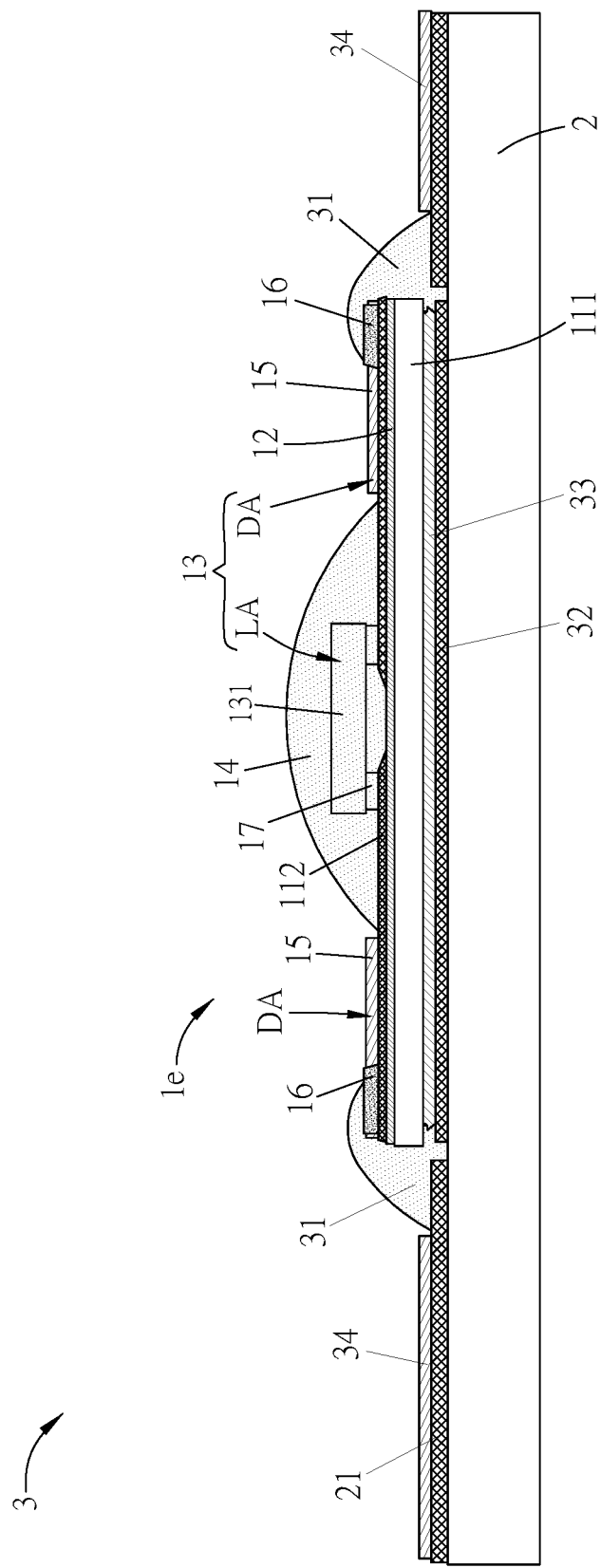
FIG. 7 is a schematic diagram showing an electronic device according to an embodiment of this disclosure.

FIG. 7 is a schematic diagram showing an electronic device according to an embodiment of this disclosure. As shown in FIG. 7, the electronic device 3 comprises a driving circuit board 2, a plurality of package structures 1e, and a plurality of conductive materials 31. To be noted, FIG. 7 only shows one package structure 1e. The driving circuit board 2 comprises a conductive layer 21. The plurality of package structures 1e are disposed on the driving circuit board 2, and the plurality of conductive materials 31 are disposed on the conductive layer 21. In this embodiment, the conductive materials 31 can be conductive paste or conductive adhesive such as, for example but not limited to, Cu paste, Ag paste, solder paste, or ACP. Accordingly, the photoelectric element 131 of each package structure 1e can be electrically connected to the conductive layer 21 of the driving circuit board 2 through the patterned circuits 112, the first electrical connecting pads 16, and the conductive materials 31, so that the driving circuit board 2 can drive the photoelectric elements 131 of the package structures 1e to emit light.

The package structure 1e can be any of the above mentioned package structures 1 and 1a to 1d, or any of their modifications. The package structure 1e of this embodiment is a modification of the package structure 1. In the package structure 1e, the light reflective layer 12 is located below the wire layer (patterned circuit 112), so that the light reflective layer 12 is disposed between the patterned circuit 112 and the substrate 111. Thus, the light absorption layer 15 and the first electrical connecting pad(s) 16 can be directly disposed on the patterned circuit 112 and directly contacted to the patterned circuit 112. In addition, the electronic device 3 of this embodiment further comprises a light absorption element 32 disposed between the package structure 1e and the driving circuit board 2, and the package structure 1e is disposed on the light absorption element 32 through an adhesive element 33. Moreover, the electronic device 3 of this embodiment may further comprise another light absorption layer 34 disposed around the package structure 1e and the conductive material 31 and located on the conductive layer 21, thereby further increasing the contrast of the electronic device 3.

In some embodiments, the plurality of package structures 1e can be separately disposed on the driving circuit board 2 and be electrically connected to the driving circuit board 2. According to the requirements of the clients, the package structures 1e can be arranged in a column, a row, an array (columns and rows), a polygon, or an irregular shape. In some embodiments, the plurality of package structures 1e can be jointed to form a matrix (columns and rows) so as to construct an AM electronic device, such as, for example but not limited to, an AM LED display device, an AM Mini LED display device, or an AM Micro LED display device.

As mentioned above, in the package structure, manufacturing method thereof and electronic device of this disclosure, the visual unit is coupled with a first area configured with a photoelectric element and a second area defined along the periphery of the first area and encompassing the first area. Accordingly, when the encapsulation element, which is likely transparent itself with or without mixtures, completely covers the first area of the visual unit, the average reflectance inside the encapsulation element is greater than an average reflectance outside the encapsulation element, within the package structure. As a result, the package structure and electronic device of this disclosure can have a high contrast property, thereby improving product competitiveness.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A package structure, comprising:
    a substrate;
    a wire layer disposed on the substrate, wherein the wire layer comprises a plurality of patterned circuits;
    a visual unit defined on the substrate, wherein the visual unit comprises a first area and a second area, the second area defined along a periphery of the first area and encompassing the first area, the first area is configured with a photoelectric element, and the photoelectric element is electrically connected to and disposed corresponding to at least one of the patterned circuits;
    an encapsulation element disposed on the substrate, wherein the encapsulation element completely covers the first area of the visual unit and overlaps the corresponding one of the patterned circuits, such that an average reflectance inside the encapsulation element is greater than an average reflectance outside the encapsulation element;

a plurality of first electrical connecting pads disposed on the substrate, wherein the first electrical connecting pads are disposed around the visual unit and corresponding to the patterned circuits of the wire layer; and a plurality of second electrical connecting pads disposed on the substrate, wherein the second electrical connecting pads are disposed on the wire layer, and the photoelectric element of the visual unit is connected to the wire layer through the second electrical connecting pad.

2. The package structure according to claim 1, wherein the substrate is a flexible substrate.

3. The package structure according to claim 1, wherein the substrate is a light absorption substrate or a light reflection substrate.

4. The package structure according to claim 1, further comprising:

a light absorption layer disposed on the substrate, wherein the light absorption layer is disposed along the periphery of the first area of the visual unit and encompassing the first area, and the light absorption layer is defined as the second area of the visual unit.

5. The package structure according to claim 1, further comprising:

a light reflective layer disposed on the substrate, wherein the light reflective layer is disposed above or below the wire layer, and at least a part of the light reflective layer is defined as the first area of the visual unit.

6. The package structure according to claim 5, wherein the wire layer is disposed between the light reflective layer and the substrate.

7. The package structure according to claim 5, further comprising:

a light absorption layer disposed on the substrate or the light reflective layer, wherein the light absorption layer is disposed along the periphery of the first area of the visual unit, and the light absorption layer is defined as the second area of the visual unit.

8. The package structure according to claim 7, wherein the wire layer is disposed between the light reflective layer and the substrate, or the light reflective layer is disposed between the wire layer and the substrate.

9. An electronic device, comprising:

a driving circuit board comprising a conductive layer;

a plurality of package structures disposed on the driving circuit board, wherein each of the plurality of package structures comprises:

a substrate;

a wire layer disposed on the substrate, wherein the wire layer comprises a plurality of patterned circuits;

a visual unit defined on the substrate, wherein the visual unit comprises a first area and a second area, the second area defined along a periphery of the first area and encompassing the first area, the first area is configured with a photoelectric element, and the photoelectric element is electrically connected to and disposed corresponding to at least one of the patterned circuits; and an encapsulation element disposed on the substrate, wherein the encapsulation element completely covers the first area of the visual unit and overlaps the corresponding one of the patterned circuits, such that an average reflectance inside the encapsulation element is greater than an average reflectance outside the encapsulation element; and a plurality of conductive materials disposed on the conductive layer;

wherein, the photoelectric element of each of the package structures is electrically connected to the conductive layer of the driving circuit board through the patterned circuits and the conductive materials.

10. The electronic device according to claim 9, wherein the substrate is a flexible substrate.

11. The electronic device according to claim 9, wherein the substrate is a light absorption substrate or a light reflection substrate.

12. The electronic device according to claim 9, further comprising:

a light absorption layer disposed on the substrate, wherein the light absorption layer is disposed along the periphery of the first area of the visual unit and encompassing the first area, and the light absorption layer is defined as the second area of the visual unit.

13. The electronic device according to claim 9, further comprising:

a light reflective layer disposed on the substrate, wherein the light reflective layer is disposed above or below the wire layer, and at least a part of the light reflective layer is defined as the first area of the visual unit.

14. The electronic device according to claim 13, further comprising:

a light absorption layer disposed on the substrate or the light reflective layer, wherein the light absorption layer is disposed along the periphery of the first area of the visual unit, and the light absorption layer is defined as the second area of the visual unit.

15. The electronic device according to claim 13, wherein the wire layer is disposed between the light reflective layer and the substrate.

16. A package structure, comprising:

a substrate;

a wire layer disposed on the substrate, wherein the wire layer comprises a plurality of patterned circuits;

a visual unit defined on the substrate, wherein the visual unit comprises a first area and a second area, the second area defined along a periphery of the first area and encompassing the first area, the first area is configured with a photoelectric element, and the photoelectric element is electrically connected to and disposed corresponding to at least one of the patterned circuits;

an encapsulation element disposed on the substrate, wherein the encapsulation element completely covers the first area of the visual unit and overlaps the corresponding one of the patterned circuits, such that an average reflectance inside the encapsulation element is greater than an average reflectance outside the encapsulation element;

a plurality of through holes disposed on the substrate, wherein the through holes are disposed corresponding to the patterned circuits of the wire layer; and a conductive element disposed in the through holes and electrically connected to the corresponding patterned circuits, wherein the conductive element is electrically connected to the photoelectric element of the visual unit through the corresponding patterned circuits.

17. The package structure according to claim 16, wherein the substrate is a flexible substrate.

18. The package structure according to claim 16, wherein the substrate is a light absorption substrate or a light reflection substrate.

19. The package structure according to claim 16, further comprising:

a light reflective layer disposed on the substrate, wherein the light reflective layer is disposed above or below the wire layer, and at least a part of the light reflective layer is defined as the first area of the visual unit.

20. The package structure according to claim 16, further comprising:
a light absorption layer disposed on the substrate, wherein the light absorption layer is disposed along the periphery of the first area of the visual unit and encompassing the first area, and the light absorption layer is defined as the second area of the visual unit.

* * * * *